United States Patent [19]
Ackerman

[11] Patent Number: 5,319,666
[45] Date of Patent: Jun. 7, 1994

[54] ARTICLE COMPRISING A DISTRIBUTED FEEDBACK LASER

[75] Inventor: David A. Ackerman, Hopewell, N.J.

[73] Assignee: AT&T Bell Laboratories, Murray Hill, N.J.

[21] Appl. No.: 43,916

[22] Filed: Apr. 7, 1993

[51] Int. Cl.[5] ............................................. H01S 3/08
[52] U.S. Cl. ...................................... 372/96; 372/45; 372/50
[58] Field of Search ............................ 372/96, 45, 50

[56] References Cited

U.S. PATENT DOCUMENTS

| | | | |
|---|---|---|---|
| 4,704,720 | 11/1987 | Yamaguchi | 372/96 |
| 4,852,116 | 7/1989 | Takiguchi et al. | 372/96 |
| 5,012,484 | 4/1991 | Flynn et al. | 372/96 |
| 5,020,072 | 5/1991 | Abe et al. | 372/96 |
| 5,111,475 | 5/1992 | Ackerman et al. | 372/96 |

OTHER PUBLICATIONS

"Theory of Dielectric Optical Waveguides", by D. Marcuse, *Academic Press*, New York, 1974, pp. 49–59.
"Growth and Characterization of High Yield, Reliable, High-Power, High-Speed, InP/InGaAsP Capped Mesa Buried Heterostructure Distributed Feedback (CMBH-DFB) Lasers", J. L. Zilko et al., *IEEE Journal of Quantum Electronics*, vol. 25, No. 10, Oct. 1989, pp. 2091–2095.

*Primary Examiner*—Georgia Y. Epps
*Attorney, Agent, or Firm*—Eugen E. Pacher

[57] ABSTRACT

In some applications of distributed feedback (DFB) lasers, it is important that the coupling constant $\kappa$ be closely controlled. This is not easily achieved, frequently resulting in low yield of acceptable devices. I have discovered that variations in $\kappa$ can be reduced if the DFB laser is designed such that the thickness $t_s$ of a spacer layer (between the active layer and the Bragg grating) is within about $\pm 10\%$ of the value $t_0/(1-\alpha)$, where $t_0$ is the modal decay length, and $\alpha$ is a parameter which characterizes the fractional variation of $t_0$ with fractional changes in layer thickness.

5 Claims, 1 Drawing Sheet

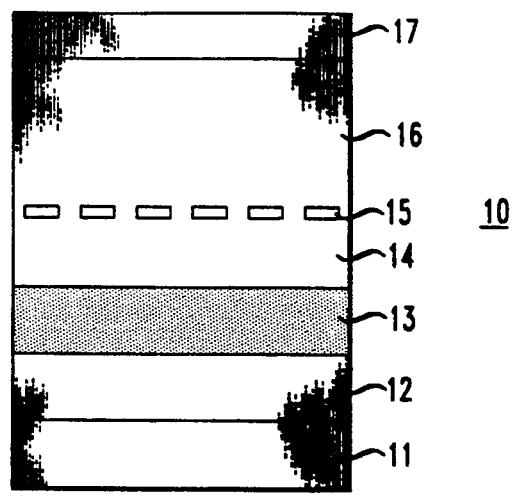
FIG. 1
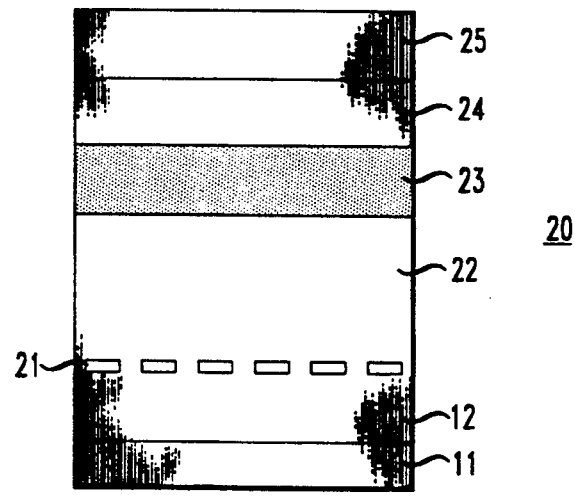
FIG. 2
FIG. 3
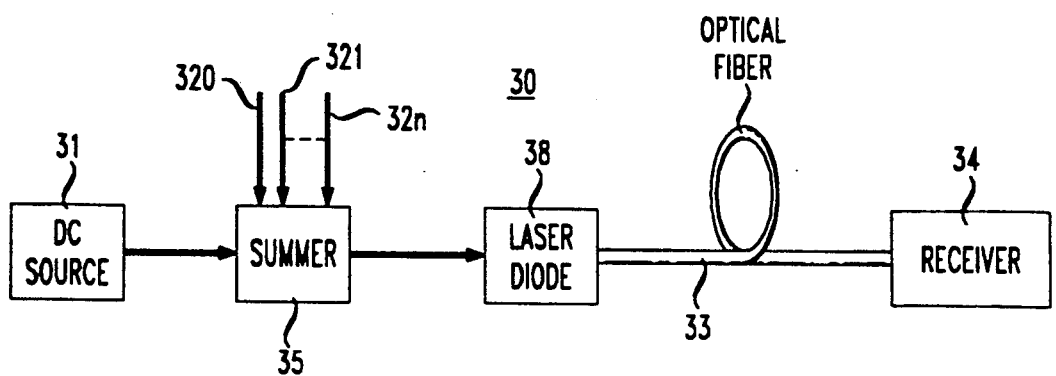

ARTICLE COMPRISING A DISTRIBUTED FEEDBACK LASER

FIELD OF THE INVENTION

This invention pertains to distributed feedback semiconductor lasers, and to articles (e.g., an optical fiber analog CATV system) that comprise such a laser.

BACKGROUND OF THE INVENTION

Distributed feedback (DFB) semiconductor lasers are known. Such lasers comprise a feature that serves to suppress emission of radiation of all but one longitudinal spatial mode. In one well known type of DFB laser the feature is a "grating", e.g., a "corrugated" interface between two semiconductor layers. The grating is spaced from the active region of the laser and can be located either below or above the active region.

The degree of interaction of the radiation field in the laser cavity (of length L) with the grating is generally expressed in terms of the coupling constant $\kappa$, a parameter that depends on the spacing between the active region and the grating, and also depends on the "strength" of the grating. Maintenance of $\kappa$ within relatively narrow limits is an important manufacturing requirement for at least some grating DFB lasers, e.g., for such lasers that are intended for use in analog applications such as optical fiber analog CATV. See, for instance, U.S. Pat. Nos. 5,012,484 and 5,111,475, both incorporated herein by reference. In these lasers $\kappa L$ is desirably within relatively narrow limits of a predetermined value that maximizes linearity of the laser output as a function of drive current. For instance, the specifications for one such device call for the normalized variation of $\kappa L$ (i.e., $\delta(\kappa L)/\kappa L$) to be at most about 13%. This is a requirement that is difficult to meet with at least some prior art grating DFB lasers, resulting in low manufacturing yield, and consequently, high cost of the lasers.

Among the reasons for the difficulty of close control of $\kappa L$ is the difficulty of close control in a manufacturing environment of the spacing between the active region of the laser and the grating. For instance, it is known that even a minor departure of the wafer temperature from the target temperature during layer growth can significantly affect the layer growth rate. Furthermore, applicable growth techniques (e.g., MOCVD) typically result in at least some layer thickness variation across the wafer.

In view of the commercial significance of grating DFB lasers with closely controlled value of $\kappa L$, it would be desirable to have available such lasers that are less subject to $\kappa L$ variation than are corresponding prior art lasers. This application discloses such laser.

SUMMARY OF THE INVENTION

In a broad aspect the invention is embodied in an article that comprises an improved DFB semiconductor laser. More specifically, the DFB laser comprises a semiconductor body and means (e.g., contact pads) for facilitating flow of an electric current through the body. Associated with the laser is a modal decay length $t_o$ and a parameter $\alpha$ which characterizes the fractional variation of $t_o$ with fractional changes in layer thickness. The semiconductor body is a multilayer structure that comprises a substantially planar active layer (frequently comprising one or more quantum wells), a "grating" that is substantially parallel with the active layer, and a spacer layer of thickness $t_s$ between the active layer and the grating. Significantly, $t_s$ is selected to be in the range $[t_o/(1-\alpha)] \pm 10\%$.

I have made the surprising discovery that, for this particular choice of spacer layer thickness, the value of $\kappa L$ of at least some DFB lasers is relatively immune to, typically unavoidable, variations in some manufacturing conditions, resulting in improved manufacturability. Although the invention can be embodied in lasers with grating under the active (GUA) region, it is most advantageously embodied in lasers with grating over the active (GOA) region.

BRIEF DESCRIPTION OF THE DRAWINGS

FIGS. 1 and 2 schematically depict the layer sequence of an exemplary GOA and GUA DFB laser, respectively; and FIG. 3 schematically shows an exemplary article according to the invention, a multichannel analog optical fiber communication system.

DETAILED DESCRIPTION OF SOME EXEMPLARY EMBODIMENTS

FIG. 1 schematically depicts the layer structure of an exemplary GOA DFB laser 10 according to the invention. Numeral 11 refers to the semiconductor (e.g., InP) substrate, and numerals 12-17 to the buffer layer, active layer, spacer layer, grating layer, clad layer and cap layer, respectively. Lasers having the depicted layer sequence are known in the art. The active layer may, but need not, comprise one or more quantum wells.

FIG. 2 schematically depicts the layer structure of an exemplary GUA DFB laser 20 according to the invention. Numeral 11 again refers to the substrate, and numerals 12, 21-25 refer to the buffer layer, grating layer, spacer layer, active layer, cladding layer and cap layer, respectively. Lasers having such a layer structure are known. The active layer may comprise one or more quantum wells.

Underlying the invention is the realization that in many DFB lasers some departures from desired design values are correlated. For instance, in MOCVD growth of multilayer III/V semiconductor structures, layer thickness frequently unintentionally decreases from wafer center towards wafer periphery. Thus, the thickness of the, e.g., spacer layer and of the grating layer both typically are functions of radial position on the wafer, but the ratio of spacer layer thickness to grating layer thickness frequently is substantially independent of radial position. Similarly, the substrate temperature frequently is a function of radial position on the wafer, resulting in position-dependent growth rates and therefore layer thicknesses.

A known laser parameter is the modal decay length $t_o$. This parameter is associated with a given active layer and is calculable, for any given laser, by a known method. See, for instance, D. Marcuse, "Theory of Dielectric Waveguides", Academic Press, New York, 1974, especially pp. 49-59. Control of $t_o$ generally involves control of active layer thickness and refractive index or indices.

The following theoretical exposition is provided for pedagogical purposes only and is not to be construed as a limitation on the scope of the invention. Recited numerical values pertain to a particular GOA DFB laser design, namely, an InP-based laser that comprises 550 $\mu$m top and bottom separate confinement layers, seven 6 nm wells surrounded by 7 nm barriers in the active region, an InP spacer layer of thickness $t_s$, and a grating layer of thickness $t_q$ and refractive index $n_q$. The mesa width is 1.0 μm. In such a structure, the value of $\kappa L$ typically can be adjusted, without substantial perturbation of the transverse optical mode, by independent variation of $t_s$, $t_q$ and $n_q$.

It is known that $\kappa L$ is at least approximately equal to $At_q(\Delta n)\exp-(t_s/t_o)$, wherein A is a constant, and $\Delta n = n_q - n_{InP}$. For the exemplary laser structure, $t_o$ is found, by a technique that is outlined in the above cited monograph by Marcuse, to be approximately 270 nm. Using the above expression for $\kappa L$, one obtains $$\delta(\kappa L)/\kappa L = \delta(\Delta n)/(\Delta n) + \delta t_q/t_q - (t_s/t_o)(\delta t_s/t_s) + (t_s/t_o)(\delta t_o/t_o) \quad (1)$$

For the reasons indicated above, fractional deviations from target thickness of spacer layer and grating layer will frequently be substantially equal (i.e., $\delta t_s/t_s \sim \delta t_q/t_q$) and proportional to $\delta t_o/t_o$. Thus, one can set $\delta t_s/t_s = \delta t_q/t_q = \delta T/T$, and $\delta t_o/t_o = \alpha \delta T/T$, where T is the nominal wafer temperature, and $\alpha$ is a parameter whose value can be determined by computation of $t_o$ for various values of $\delta T/T$. In the exemplary case, $\alpha$ is approximately equal to $-1.25$. Making the indicated substitutions in equation (1) yields $$\delta(\kappa L)/\kappa L = \delta(\Delta n)/(\Delta n) + \delta T/T(1-(t_s/t_o)(1-\alpha)). \quad (2)$$

Choosing $t_s/t_o$ such that $(1-(t_s/t_o))(1-\alpha) = 0$ eliminates the implicitly temperature-dependent (i.e., layer thickness-related) contribution to the variation in $\kappa L$, leaving only the contribution due to refractive index variation. This is accomplished if $$t_s = t_o/(1-\alpha) \quad (3)$$

Advantages are of course obtained not only if equation (3) is exactly satisfied, but also within a limited range of spacer layer thickness around the desired value. Typically, this range will be about ±10% of the value according to equation (3). Choice of $t_s$ outside this range will typically not result in a significantly more manufacturable laser, as compared to analogous prior out lasers.

The DFB lasers referred to in the examples below have structure, and are made, substantially as described J. L. Zilko et al., *IEEE Journal of Quantum Electronics*, Vol. 25(10), p. 2091, incorporated herein by reference, except that they have GOA structure. Those skilled in the art will be readily able to adapt the disclosed procedure to make GOA DFB lasers.

EXAMPLE 1

For the contemplated design, $t_o$ and $\alpha$ are determined substantially as described by D. Marcuse, op. cit. On a InP wafer is grown a multilayer structure substantially as shown in FIG. 1, with growth conditions selected such that $t_s$ is approximately (better than ±10%) equal to $t_o/(1-\alpha)$. After completion of manufacture, the thus produced lasers are tested, with the test results indicating that more than ~80% of the lasers have $\kappa L$ within 13% of the design value.

EXAMPLE 2

Lasers are produced substantially as in Example 1, except that the growth conditions are selected such that $t_s$ differs by more than 10% from the value $t_o/(1-\alpha)$. The resulting lasers are tested, with the test results indicating that, compared to the lasers of Example 1, fewer lasers have $\kappa L$ within 13% of the design value.

FIG. 3 schematically depicts a multichannel analog optical fiber communication system 30. The system comprises transmitter means that comprise DC source 31, summer 35 and laser diode 38, receiver means 34, and optical fiber 33 signal-transmissively connecting transmitter and receiver means. Multiple inputs 320-32n are provided to the summer, and the laser diode is a diode according to the invention.

I claim:

1. An article comprising a distributed feedback semiconductor laser comprising a semiconductor body and means for facilitating flowing an electric current through the body, associated with the laser being a modal decay length $t_o$ and a parameter $\alpha$, the body being a multilayer structure comprising
   a) a substantially planar active layer,
   b) a grating that is substantially parallel with the active layer; and
   c) a spacer layer of thickness $t_s$ between said active layer and said grating; characterized in that
   d) $t_s$ is within the range $[t_o/(1-\alpha)]\pm 10\%$.

2. Article according to claim 1, wherein said multilayer structure comprises a substrate, with the grating being located between the substrate and the active layer.

3. Article according to claim 1, wherein said multilayer structure comprises a substrate, with the active layer being located between the substrate and the grating.

4. Article according to claim 1, wherein said semiconductor body comprises InP.

5. Article according to claim 1, the article being a multichannel analog optical fiber communication system comprising transmitting means, receiving means, and a length of optical fiber signal-transmissively connecting the transmitting means and the receiving means, said transmitting means comprising said laser.

* * * * *